United States Patent
Murakami (10) Patent No.: US 7,915,952 B2
(45) Date of Patent: Mar. 29, 2011

(54) SEMICONDUCTOR INTEGRATED CIRCUIT

(75) Inventor: Hideaki Murakami, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 449 days.

(21) Appl. No.: 12/167,827

(22) Filed: Jul. 3, 2008

(65) Prior Publication Data

US 2009/0008992 A1     Jan. 8, 2009

(30) Foreign Application Priority Data

Jul. 4, 2007   (JP) ................................. 2007-176403

(51) Int. Cl.
*H03K 5/00* (2006.01)
(52) U.S. Cl. .......................... 327/558; 307/146; 375/298
(58) Field of Classification Search .......... 327/231–238, 327/254, 256–259, 291, 558; 307/11, 64, 307/66; 375/238, 302, 308, 276, 298, 146, 375/149
See application file for complete search history.

(56) References Cited

U.S. PATENT DOCUMENTS

| | | | | |
|---|---|---|---|---|
| 3,209,262 A | * | 9/1965 | Reynolds | 375/312 |
| 3,519,939 A | * | 7/1970 | Kanichi | 455/169.2 |
| 6,118,309 A | * | 9/2000 | Akamatsu et al. | 327/108 |
| 6,191,632 B1 | * | 2/2001 | Iwata et al. | 327/295 |
| 7,245,153 B2 | | 7/2007 | Murakami et al. | |
| 7,330,420 B2 | | 2/2008 | Kimura et al. | |
| 2008/0122380 A1 | * | 5/2008 | Matsui et al. | 315/276 |

FOREIGN PATENT DOCUMENTS

| | | |
|---|---|---|
| JP | 2682397 | 8/1997 |
| JP | 11-103248 | 4/1999 |
| JP | 3705842 | 8/2005 |
| KR | 2001-31135 | 4/2001 |
| KR | 10-2004-0010334 | 1/2004 |
| WO | WO-99/24852 | 5/1999 |

OTHER PUBLICATIONS

Korean Office Action, Jun. 22, 2009.

* cited by examiner

*Primary Examiner* — Rajnikant B Patel
(74) *Attorney, Agent, or Firm* — Dickstein Shapiro LLP

(57) ABSTRACT

In a semiconductor integrated circuit, a switching circuit controls the capacity of a capacitor unit based on a control signal from a control circuit and separates a resonant frequency determined by first inductance, second inductance, and the capacity of the capacitor unit from the band area of the signal handled by an A/D converter.

5 Claims, 7 Drawing Sheets

FIG.8

SEMICONDUCTOR INTEGRATED CIRCUIT

BACKGROUND OF THE INVENTION

1. Field of the Invention

The preset invention relates to a semiconductor integrated circuit having a capacitor connected between a power source and a ground.

2. Description of the Related Art

Figure 1:
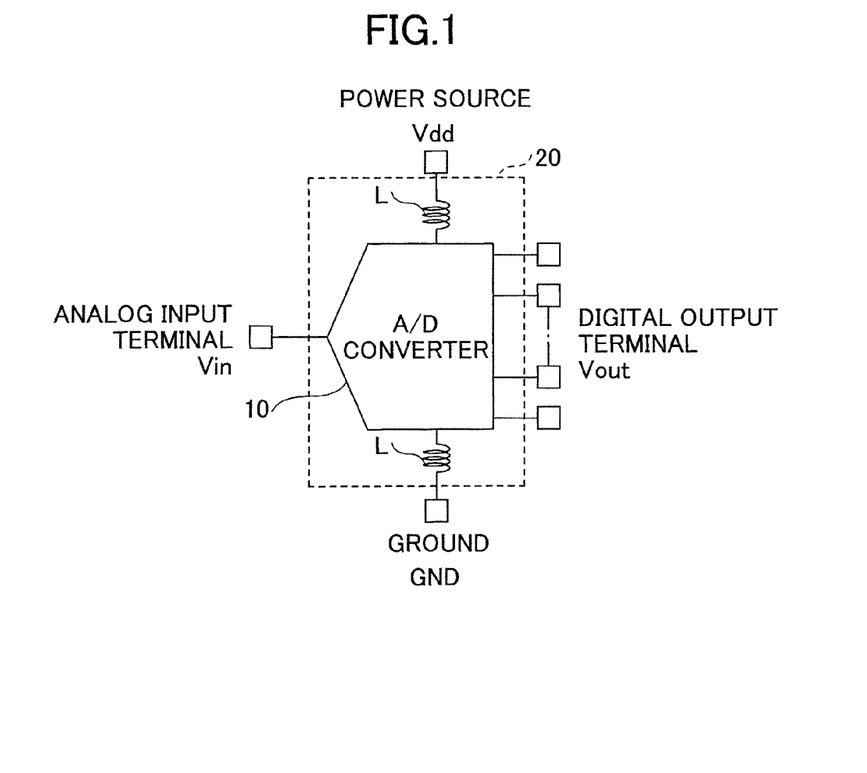
FIG. 1 is a diagram for explaining a conventional semiconductor integrated circuit whose main circuit is an A/D (Analog/Digital) converter.

Recent semiconductor integrated circuits are of a type in which a circuit for realizing various functions is integrated. FIG. 1 is a diagram for explaining a conventional semiconductor integrated circuit whose main circuit is an A/D (Analog/Digital) converter.

The A/D converter 10 is a circuit that converts an analog signal into a digital signal and has both an analog circuit and a digital circuit therefor. In the A/D converter 10, for example, a power source and a ground are connected to a power source terminal Vdd and a ground terminal GND, respectively, via the wires and the lead frames in the semiconductor integrated circuit 20 on which the A/D converter 10 is mounted so that a power source is supplied. Generally, the power source supplied to the A/D converter 10 from the outside is a stable power source having low output resistance and capable of dealing with even a small variation in internal current.

However, the wires and the lead frames in the semiconductor integrated circuit 20 have inductance L (parasitic inductance). The semiconductor integrated circuit 20 resonates at a specific frequency based on the inductance L and the internal capacity of the A/D converter 10 and varies the potential of the power source terminal Vdd or the ground terminal GND. Resonant frequency fr is expressed by Formula 1 as follows.

$$f_r = \frac{1}{2\pi\sqrt{LC}} \quad \text{(Formula 1)}$$

(L: Inductance, C: Capacitance)

If this resonant frequency enters the band area of an analog signal, a S/N (Signal-to-Noise) ratio is degraded and a desired characteristic cannot be obtained in the A/D converter 10. Furthermore, if the resonant frequency overlaps the frequency of a digital signal even where it does not enter the band area of the analog signal, a signal is delayed and degraded, thereby causing a malfunction. Besides the resonant frequency, impedance Z generated at that time is also varied based on frequency, inductance, capacity, etc., as expressed by Formula 2 as follows.

$$Z = \sqrt{\frac{R^2 + \omega^2 L^2}{(1-\omega^2 LC) + \omega^2 C^2 R^2}} \quad \text{(Formula 2)}$$

Figure 2:
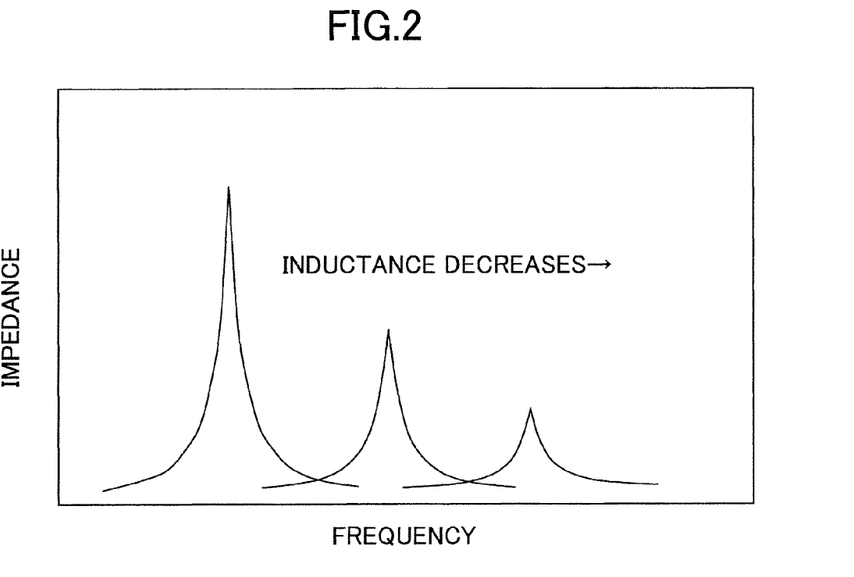
FIG. 2 is a first graphical representation showing the frequency characteristic of impedance based on different combinations of capacity and inductance.

$\begin{pmatrix} L: \text{Inductance, } C: \text{Capacitance,} \\ R: \text{Resistance, } \omega: \text{Angular Frequency} \end{pmatrix}$ FIG. 2 is a first graphical representation showing the frequency characteristic of impedance based on different combinations of the capacity and the inductance. The example of FIG. 2 shows the frequency characteristic of the impedance when the inductance increases or decreases with the capacity being constant. According to FIG. 2, as the inductance decreases with the capacity being constant, the resonant frequency is shifted to the high frequency side and the impedance becomes smaller.

Figure 3:
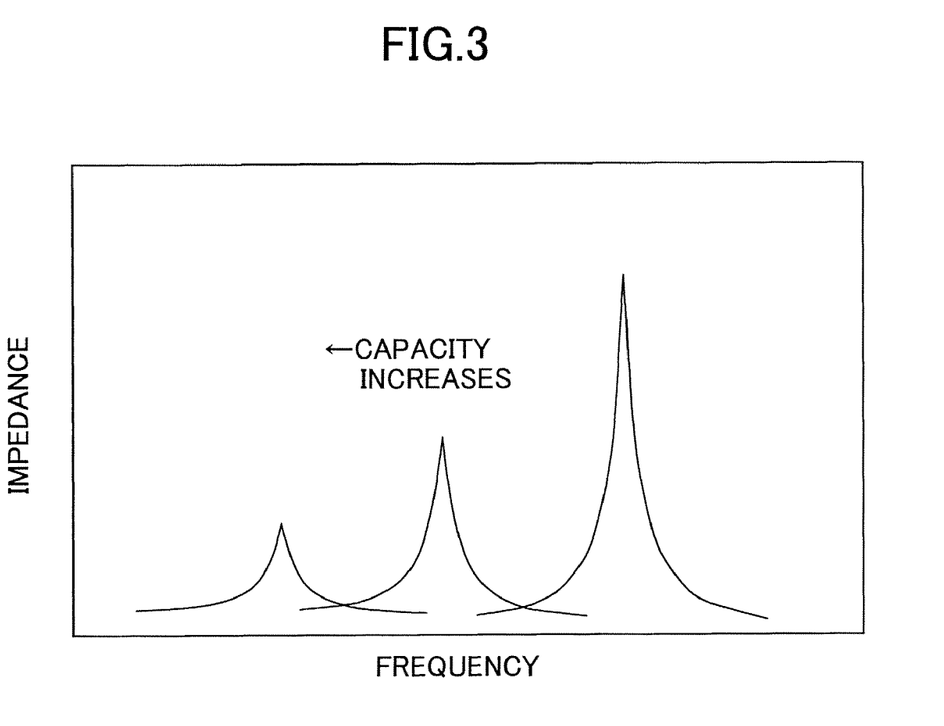
FIG. 3 is a second graphical representation showing the frequency characteristic of the impedance based on different combinations of the capacity and the inductance.

FIG. 3 is a second graphical representation showing the frequency characteristic of the impedance based on different combinations of the capacity and the inductance. The example of FIG. 3 shows the frequency characteristic of the impedance when the capacity increases or decreases with the inductance being constant. According to FIG. 3, as the capacity increases with the inductance being constant, the resonant frequency is shifted to the low frequency side and the impedance also becomes smaller.

From the above characteristics, for example, when a parasitic inductance from the power source unit of a circuit to the terminal unit of a package is 20 nH and the capacity between a power source and a ground is 50 pF, the resonant frequency is approximately 160 MHz. This resonant frequency may enter the band area of an analog signal operating at high speed. In this case, the resonant frequency acts as a noise source. Furthermore, when the parasitic inductance is 10 nH and the capacity is 10 pF, the resonant frequency is approximately 500 MHz. This resonant frequency may enter the band area of a digital signal. In this case, the resonant frequency acts as a noise source.

As a technique for preventing such noise, for example, Patent Document 1 describes a semiconductor integrated circuit that reduces a voltage variation occurring in the source of a driver using a variation in the gate voltage of the driver so that data can be transmitted at high speed and accurately. Patent Document 2 describes a semiconductor device that stably maintains voltage on an internal node at a constant level. Patent Document 3 describes a cell-base designed semiconductor integrated circuit device that has capacitor cells arranged in a wiring area using a cell-based design technique to realize a bypass capacitor between power source wiring and GND wiring in a LSI without increasing the chip size and to improve the noise resistance of the LSI.

Although the most effective method of preventing the noise is to make the parasitic inductance zero, the execution of this method is actually impossible. Another method is to make the capacity infinite. With this method, the impedance can be made zero. However, the execution of this method is also impossible. Therefore, the combination of possible values of the inductance and the capacity is actually made so as to find common ground. However, the resonant frequency may enter the band area of a signal depending on the combination. In addition, the frequency characteristic may be significantly degraded depending on impedances.

Patent Document 1: JP-A-11-103248
Patent Document 2: JP-B2-3705842
Patent Document 3: JP-B2-2682397

SUMMARY OF THE INVENTION

Accordingly, the present invention has been made to solve the above problems and may provide a semiconductor integrated circuit capable of improving a signal-to-noise ratio.

To this end, the present invention adopts the following configurations.

According to an aspect of the present invention, a semiconductor integrated circuit is provided that comprises a main body circuit connected between a power source and a ground; inductance between the power source and/or the ground and the main body circuit; a capacitor connected between the side of the power source of the main body circuit and the side of the ground of the main body circuit; and a control circuit that controls the capacity of the capacitor. In the semiconductor integrated circuit, when the capacity of the capacitor is controlled by the control circuit, a resonant frequency determined by the capacitor and the inductance is controlled.

According to this configuration, the semiconductor integrated circuit capable of improving a signal-to-noise ratio can be provided.

Preferably, the capacitor may be composed of a p-channel transistor or an n-channel transistor.

According to this configuration, it is not necessary to use special elements, so that costs can be reduced.

Preferably, the capacitor may be composed of plural of the p-channel transistors or the n-channel transistors, and the control circuit may control the number of the p-channel transistors or the n-channel transistors to be switched on.

According to this configuration, the capacity of the capacitor can be controlled by the number of the p-channel transistors or the n-channel transistors to be switched on.

Preferably, the semiconductor integrated circuit may further comprise a switching unit that controls ON/OFF of the p-channel transistor or the n-channel transistor based on a control signal from the control circuit.

According to this configuration, the capacity of the capacitor can be controlled by the ON/OFF of the p-channel transistor or the n-channel transistor.

Preferably, the switching unit may be composed of another p-channel transistor or another n-channel transistor.

According to this configuration, a circuit can be made compact.

According to the embodiments of the present invention, a semiconductor integrated circuit capable of improving a signal-to-noise ratio can be provided.

Other objects, features and advantages of the present invention will become more apparent from the following detailed description when read in conjunction with the accompanying drawings.

DETAILED DESCRIPTION OF THE PREFERRED EMBODIMENTS

According to the embodiments of the present invention, the capacity of a capacitor is controlled to thereby shift a resonant frequency as a noise source to the low frequency side or the high frequency side and separate the resonant frequency from the band area of a signal.

First Embodiment

Referring to the accompanying drawings, a description is made of a first embodiment of the present invention below.

Figure 4:
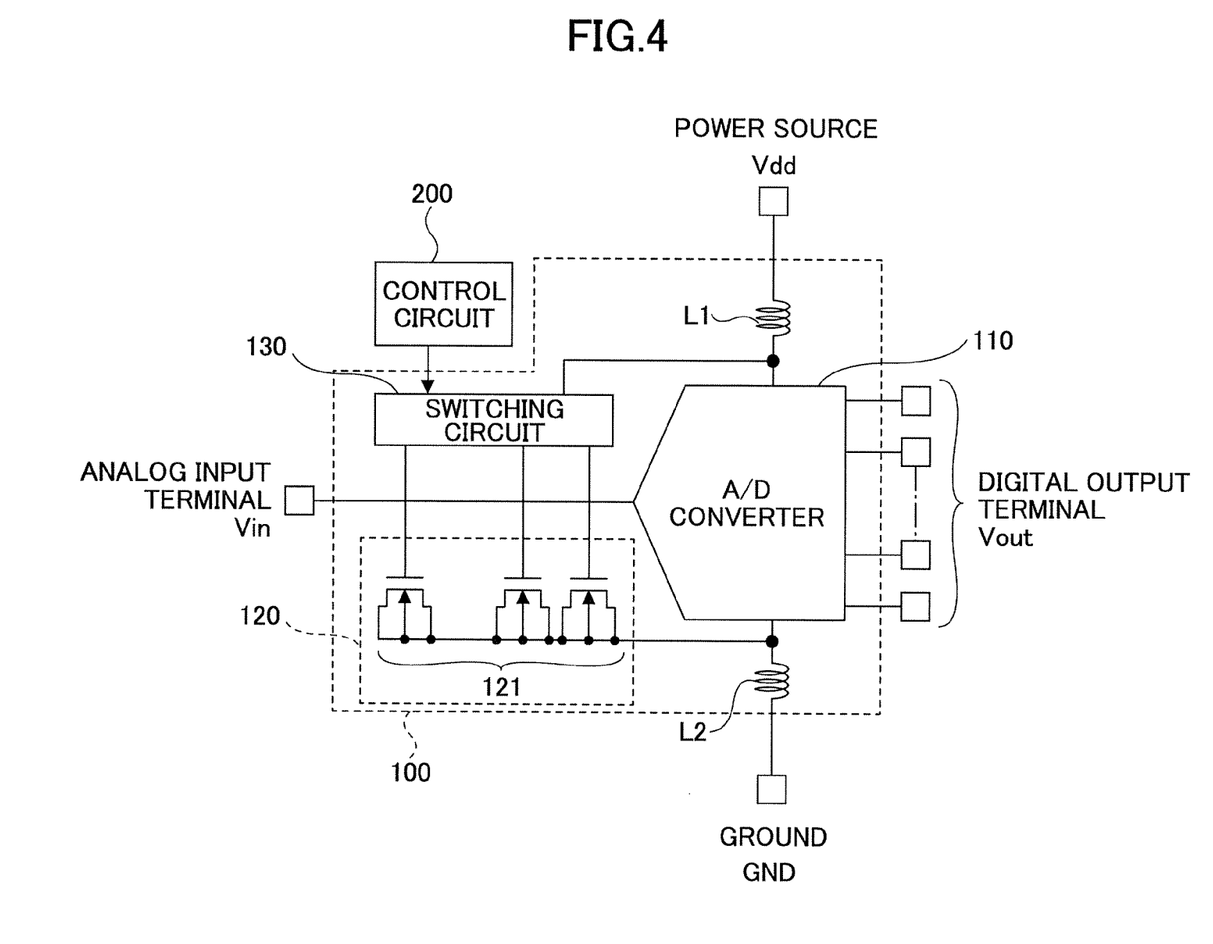
FIG. 4 is a diagram for explaining a semiconductor integrated circuit 100 of a first embodiment.

FIG. 4 is a diagram for explaining a semiconductor integrated circuit 100 of the first embodiment.

The semiconductor integrated circuit 100 of this embodiment includes an A/D converter 110, a capacitor unit 120, and a switching circuit 130.

In the semiconductor integrated circuit 100, the capacitor unit 120 and the switching circuit 130 are connected between the side of a power source Vdd of the A/D converter 110 and the side of a ground GND thereof. The switching circuit 130 controls the capacity of the capacitor unit 120 based on a control signal from a control circuit 200. In this embodiment, the capacity of the capacitor unit 120 is controlled to thereby separate the resonant frequency as a noise source from the band area of the signal handled by the A/D converter 110.

The A/D converter 110 is a main body circuit for realizing the function of the semiconductor integrated circuit 100. The A/D converter 110 converts an analog signal input from an analog input terminal Vin of the semiconductor integrated circuit 100 into a digital signal and outputs the digital signal from a digital output terminal Vout of the semiconductor integrated circuit 100.

The A/D converter 110 is connected to the power source Vdd and the ground GND outside the semiconductor integrated circuit 100 via wires and lead frames in the semiconductor integrated circuit 100. The wires and the lead frames have inductance (parasitic inductance). In this embodiment, the inductance of the wire and the lead frame on the side of the power source Vdd of the A/D converter 110 is inductance L1 and that of the wire and the lead frame on the side of the ground GND thereof is inductance L2.

The capacitor unit 120 is connected between the switching circuit 130 and the side of the ground GND of the A/D converter 110 and composed of plural n-channel transistors 121. The n-channel transistors 121 have gates connected to the power source Vdd via the switching circuit 130 and have sources, drains, and back gates connected to the ground GND. The n-channel transistors are preferably of a size in which the capacity of the gates is, for example, on the order of a pF (picofarad) or smaller.

The switching circuit 130 is connected between the side of the power source Vdd of the A/D converter 110 and the capacitor unit 120. The switching circuit 130 controls ON/OFF of the n-channel transistors 121 based on the control signal from the control circuit 200.

In the semiconductor integrated circuit 100 of this embodiment, the switching circuit 130 can change the capacity of the capacitor unit 120 by controlling the ON/OFF of the n-channel transistors 121. The capacity of the capacitor unit 120 is determined according to the number of the n-channel transistors 121 to be switched on in the capacitor unit 120.

Accordingly, in the semiconductor integrated circuit 100, the resonant frequency determined by the inductance L1, the inductance L2, and the capacity of the capacitor unit 120 can be changed through the change of the capacity of the capacitor unit 120. For example, as shown in FIG. 3, as the capacity increases with the inductance being constant, the resonant frequency becomes smaller. Assuming that the inductance L1 and the inductance L2 are constant in this embodiment, the resonant frequency can be shifted to the low frequency side through the increasing of the capacity of the capacitor unit 120. Furthermore, the resonant frequency can be shifted to the high frequency side through the decreasing of the capacity of the capacitor unit 120. Accordingly, the resonant frequency can be separated from the band area of an analog signal or a digital signal. Furthermore, even where a variation occurs in the inductance L1 and the inductance L2, the resonant frequency can be shifted to the low frequency side or the high frequency side through the change of the capacity of the capacitor unit 120.

In this embodiment, it is preferable that the total capacity of the capacitor unit 120 be an amount necessary for shifting the resonant frequency to a desired value or larger.

Next, a description is made of the control of the capacity of the capacitor unit 120 by the control circuit 200 and the switching circuit 130 in this embodiment.

Figure 5:
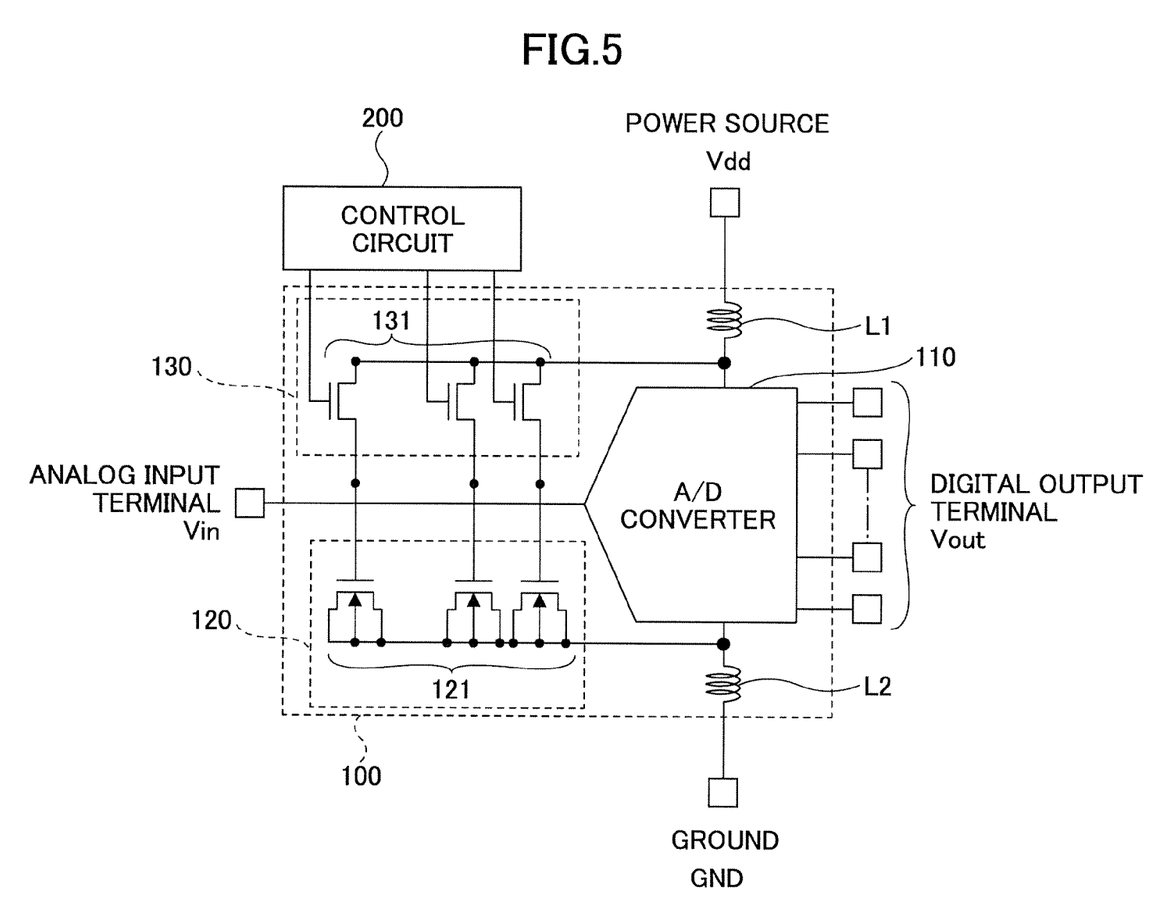
FIG. 5 is a diagram for explaining the control of the capacity of a capacitor unit 120 according to the first embodiment.

FIG. 5 is a diagram for explaining the control of the capacity of the capacitor unit 120 according to the first embodiment. FIG. 5 shows a case where the switching circuit 130 is composed of p-channel transistors 131.

The switching circuit 130 of this embodiment is composed of the p-channel transistors 131 the number of which corresponds to the n-channel transistors 121 constituting the capacitor unit 120. The p-channel transistors 131 have sources connected to the gates of the n-channel transistors 121 and have drains connected to the power source Vdd. Furthermore, the control signal from the control circuit 200 is applied to the gates of the p-channel transistors 131.

According to this embodiment, a low-level control signal is output from the control circuit 200 to the switching circuit 130. When the low-level control signal is applied to the gates of the p-channel transistors 131, the p-channel transistors 131 are switched on and the power source Vdd is applied to the gates of the n-channel transistors 121 of the capacitor unit 120. With the application of the power source Vdd, the n-channel transistors 121 are switched on.

The capacity of the capacitor unit 120 is changed according to the number of the n-channel transistors 121 to be switched on. Thus, according to this embodiment, the capacity of the capacitor unit 120 can be controlled when the number of the p-channel transistors 131 to be switched on by the switching circuit 130 is controlled. Therefore, the control circuit 200 of this embodiment controls the number of the p-channel transistors 131 to be switched on by the switching circuit 130.

Next, a description is made of the control of the control circuit 200 of this embodiment. The control circuit 200 of this embodiment is connected to the semiconductor integrated circuit 100. In the control circuit 200, an initial capacity as a reference in the capacitor unit 120 of the semiconductor integrated circuit 100 is previously set. The control circuit 200 performs control for increasing or decreasing the reference of the initial capacity.

More specifically, the number of the p-channel transistors 131 specifying the initial capacity of the capacitor unit 120 is set in the control circuit 200. The control circuit 200 outputs the control signal for switching on the set number of the p-channel transistors 131 to the switching circuit 130. Note that in this embodiment the initial capacity is set so that the resonant frequency determined by the inductance L1 and the inductance L2 expected from the circuit characteristic of the A/D converter 110 and the initial capacity exists outside the band area of the signal handled by the A/D converter 110.

When respective elements constituting the A/D converter 110 are integrated to form the semiconductor integrated circuit 100, a variation occurs in the values of the inductance L1 and the inductance L2. As a result, the resonant frequency determined by the inductance L1, the inductance L2, and the initial capacity is changed, and it may enter the band area of the signal handled by the A/D converter 110. According to this embodiment, the control circuit 200 changes the number of the p-channel transistors 131 to be switched on to increase or decrease the initial capacity, thereby shifting the resonant frequency outside the band area of the signal.

Figure 6:
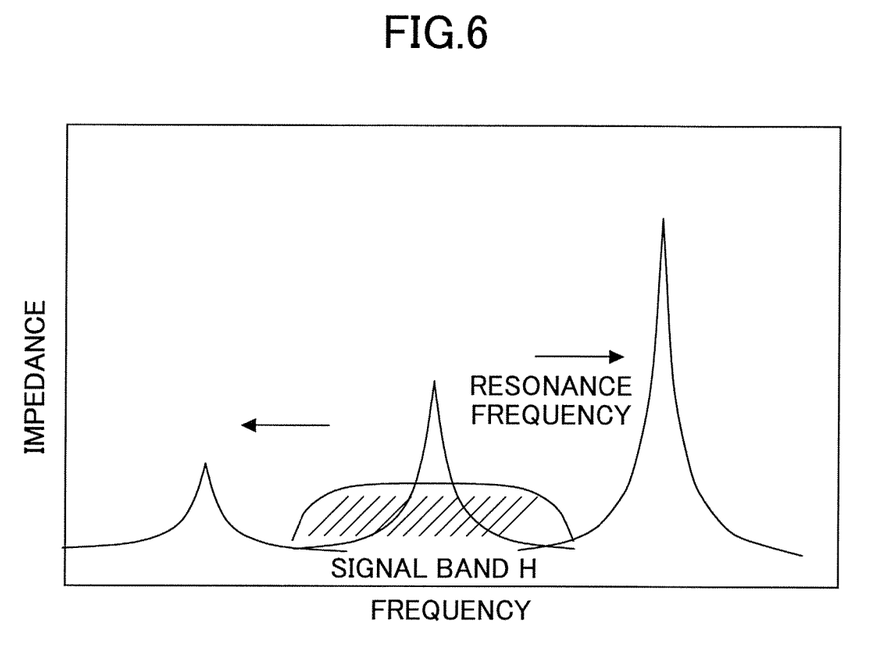
FIG. 6 is a graphical representation for explaining the shift of a resonant frequency.

FIG. 6 is a graphical representation for explaining the shift of the resonant frequency.

According to this embodiment, when the number of the p-channel transistors 131 to be switched on increases under the control of the control circuit 200, the number of the n-channel transistors 121 to be switched on also increases and the capacity of the capacitor unit 120 becomes smaller than the initial capacity. Accordingly, as shown in FIG. 6, the resonant frequency is shifted to the high frequency side separated from signal band H.

Furthermore, when the number of the p-channel transistors 131 to be switched on decreases, the number of the n-channel transistors 121 to be switched on also decreases and the capacity of the capacitor unit 120 becomes larger than the initial capacity. Accordingly, as shown in FIG. 6, the resonant frequency is shifted to the low frequency side separated from the signal band H.

As described above, according to this embodiment, the resonant frequency entering the signal band to cause a noise source is shifted to the low frequency side or the high frequency side, thereby making it possible to improve a signal-to-noise ratio.

Furthermore, in this embodiment, the capacitor unit 120 is composed of the n-channel transistors 121 and the switching circuit 130 is composed of the p-channel transistors 131. Therefore, it is not necessary to use special elements, so that costs can be reduced and the circuit can be made compact. Furthermore, according to this embodiment, the capacitor unit 120 is composed of the plural n-channel transistors 121. Therefore, the capacity of the capacitor unit 120 can be finely set.

Note that in this embodiment the control circuit 200 is provided outside the semiconductor integrated circuit 100, but it may be provided inside the semiconductor integrated circuit 100. In this case, the semiconductor integrated circuit 100 is composed of the A/D converter 110, the capacitor unit 120, the switching circuit 130, and the control circuit 200.

Furthermore, the switching circuit 130 of this embodiment is composed of the p-channel transistors 131, but it is not limited to the p-channel transistors 131. As the configuration of the switching circuit 130 of this embodiment, it is only necessary to control the ON/OFF of the n-channel transistors 121 constituting the capacitor unit 120.

Furthermore, this embodiment is applied to a case using the resonant frequency determined by the inductance L1 of the wire and the lead frame on the side of the power source Vdd of the A/D converter 110, the inductance L2 of the wire and the lead frame on the side of the ground thereof, and the capacity of the capacitor unit 120, but it is not limited to this case. For example, this embodiment can be also applied to a case using the resonant frequency determined by the inductance L1 and the capacity of the capacitor unit 120 or a case using the resonant frequency determined by the inductance L2 and the capacity of the capacitor unit 120.

Second Embodiment

Referring to the accompanying drawings, a description is made of a second embodiment of the present invention. The second embodiment is different from the first embodiment in that a capacitor unit 120A is composed of p-channel transistors 121A. Accordingly, in the following description of this embodiment, only points different from the first embodiment are described, and parts having the same functional configurations as those of the first embodiment are denoted by the same reference numerals used in the first embodiment and the description thereof is omitted.

Figure 7:
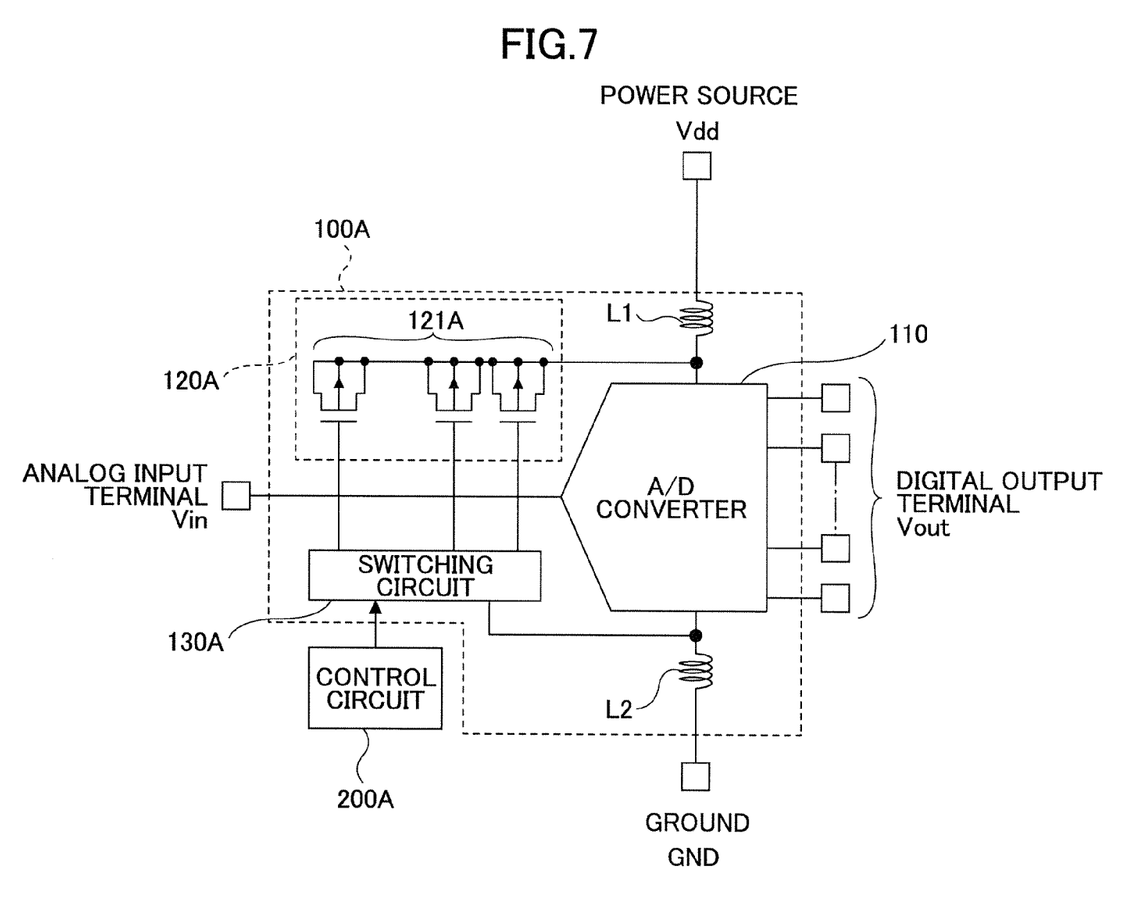
FIG. 7 is a diagram for explaining a semiconductor integrated circuit 100A of a second embodiment.

FIG. 7 is a diagram for explaining a semiconductor integrated circuit 100A of the second embodiment. The semiconductor integrated circuit 100A of the second embodiment includes a capacitor unit 120A and the switching circuit 130A.

The capacitor unit 120A of this embodiment is connected between the side of the power source Vdd of the A/D converter 110 and the switching circuit 130A. The capacitor unit 120A is composed of plural p-channel transistors 121A. The p-channel transistors 121A have gates connected to the ground GND via the switching circuit 130A and have sources, drains, and back gates connected to the power source Vdd.

The switching circuit 130A is connected between the side of the ground GND of the A/D converter 110 and the capacitor unit 120A. The switching circuit 130A controls ON/OFF of the p-channel transistors 121A based on a control signal output from a control circuit 200A connected to the semiconductor integrated circuit 100A.

Next, a description is made of the control of the capacity of the capacitor unit 120A by the control circuit 200A and the switching circuit 130A in this embodiment.

Figure 8:
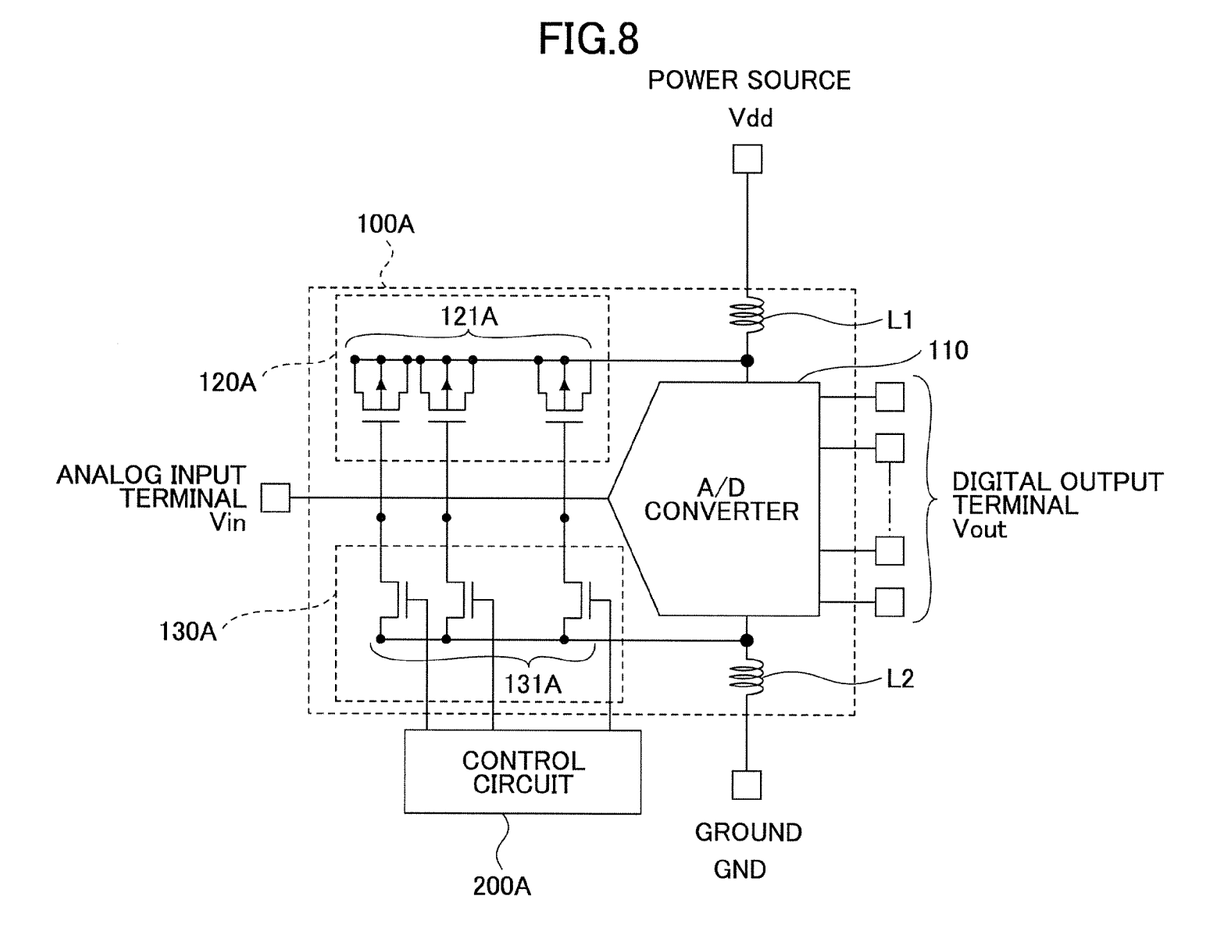
FIG. 8 is a diagram for explaining the control of the capacity of a capacitor unit 120A according to the second embodiment.

FIG. 8 is a diagram for explaining the control of the capacity of the capacitor unit 120A according to the second embodiment. FIG. 8 shows a case where the switching circuit 130A is composed of n-channel transistors 131A.

The switching circuit 130A of this embodiment is composed of the n-channel transistors 131A the number of which corresponds to the p-channel transistors 121A constituting the capacitor unit 120A. The n-channel transistors 131A have sources connected to the gates of the p-channel transistors 121A and have drains connected to the ground GND. Furthermore, the control signal from the control circuit 200A is applied to the gates of the n-channel transistors 131A.

According to this embodiment, a high-level control signal is output from the control circuit 200A to the switching circuit 130A. When the high-level control signal is applied to the gates of the n-channel transistors 131A, the n-channel transistors 131A are switched on and a low-level signal is applied to the gates of the p-channel transistors 121A of the capacitor unit 120A. With the application of the low-level signal, the p-channel transistors 121A are switched on.

The operation of the control circuit 200A of this embodiment is the same as that of the control circuit 200 of the first embodiment except that it outputs the high-level signal as the control signal. Thus, according to this embodiment, the same effects as those of the first embodiment can be obtained.

Further, in this embodiment, the control circuit 200A is provided outside the semiconductor integrated circuit 10A, but it may be provided inside the semiconductor integrated circuit 10A. In this case, the semiconductor integrated circuit 100A is composed of the A/D converter 110, the capacitor unit 120A, the switching circuit 130A, and the control circuit 200A.

Furthermore, the switching circuit 130A of this embodiment is composed of the n-channel transistors 131A, but it is not limited to the n-channel transistors 131A. As the configuration of the switching circuit 130A of this embodiment, it is only necessary to control the ON/OFF of the p-channel transistors 121A constituting the capacitor unit 120A.

The present invention is not limited to the specifically disclosed embodiments, and variations and modifications may be made without departing from the scope of the present invention.

The present application is based on Japanese Priority Application No. 2007-176403 filed on Jul. 4, 2007, the entire contents of which are hereby incorporated herein by reference.

What is claimed is:

1. A semiconductor integrated circuit comprising:
a main body circuit connected between a power source and a ground;
an inductance between the power source and/or the ground and the main body circuit;
a capacitor connected between a side of the power source of the main body circuit and a side of the ground of the main body circuit; and
a control circuit that controls a capacity of the capacitor; wherein,
when the capacity of the capacitor is controlled by the control circuit, a resonant frequency determined by the capacitor and the inductance is controlled.

2. The semiconductor integrated circuit according to claim 1, wherein
the capacitor is composed of a p-channel transistor or an n-channel transistor.

3. The semiconductor integrated circuit according to claim 2, wherein
the capacitor is composed of plural of the p-channel transistors or the n-channel transistors, and
the control circuit controls the number of the p-channel transistors or the n-channel transistors to be switched on.

4. The semiconductor integrated circuit according to claim 2, further comprising:
a switching unit that controls ON/OFF of the p-channel transistor or the n-channel transistor based on a control signal from the control circuit.

5. The semiconductor integrated circuit according to claim 4, wherein
the switching unit is composed of another p-channel transistor or another n-channel transistor.

* * * * *